United States Patent
Tadano et al.

(10) Patent No.: US 10,700,016 B2
(45) Date of Patent: Jun. 30, 2020

(54) PROTECTIVE FILM MATERIAL FOR LASER PROCESSING AND WAFER PROCESSING METHOD USING THE PROTECTIVE FILM MATERIAL

(71) Applicant: NIKKA SEIKO CO., LTD., Tokyo (JP)

(72) Inventors: Tsuyoshi Tadano, Tokyo (JP); Masafumi Hirose, Tokyo (JP); Daisuke Tomita, Tokyo (JP)

(73) Assignee: NIKKA SEIKO CO., LTD. (JP)

( * ) Notice: Subject to any disclaimer, the term of this patent is extended or adjusted under 35 U.S.C. 154(b) by 0 days.

(21) Appl. No.: 16/011,168

(22) Filed: Jun. 18, 2018

(65) Prior Publication Data
US 2019/0006295 A1    Jan. 3, 2019

(30) Foreign Application Priority Data

Jul. 3, 2017 (JP) .................................. 2017-130227

(51) Int. Cl.
| | |
|---|---|
| H01L 23/00 | (2006.01) |
| H01L 21/78 | (2006.01) |
| B23K 26/40 | (2014.01) |
| H01L 21/67 | (2006.01) |
| H01L 21/268 | (2006.01) |
| B23K 26/18 | (2006.01) |
| B23K 101/40 | (2006.01) |

(52) U.S. Cl.
CPC ............ *H01L 23/562* (2013.01); *B23K 26/18* (2013.01); *B23K 26/40* (2013.01); *H01L 21/268* (2013.01); *H01L 21/6715* (2013.01); *H01L 21/78* (2013.01); *B23K 2101/40* (2018.08)

(58) Field of Classification Search
CPC . H01L 23/562; H01L 21/268; H01L 21/6715; H01L 21/78; B23K 26/18; B23K 26/40; B23K 2101/40; B23K 26/009; B23K 26/364
See application file for complete search history.

(56) References Cited

U.S. PATENT DOCUMENTS

| | | | |
|---|---|---|---|
| 9,502,295 B2 | 11/2016 | Shinjo et al. | |
| 2015/0179538 A1* | 6/2015 | Shinjo .................. | B23K 26/009 257/797 |

FOREIGN PATENT DOCUMENTS

| | | | |
|---|---|---|---|
| CN | 104449112 B | * | 4/2017 |
| JP | 2007073670 | | 3/2007 |
| JP | 4571850 | | 10/2010 |

* cited by examiner

*Primary Examiner* — Edward Chin
(74) *Attorney, Agent, or Firm* — Adams & Wilks

(57) ABSTRACT

A protective film material for laser processing comprises a solution of a water-soluble adhesive and a water-soluble laser beam absorbent added to adjust absorbance at a wavelength of 355 nm (absorbance as calculated as a 200-times diluted solution) to 0.3 to 3. The protective film effectively absorbs an irradiated laser beam, reduces generation of debris during laser beam irradiation, and can be removed by washing with water after completion of the laser processing treatment, thereby providing reliable processing. The water-soluble adhesive is preferably a blend of polyvinyl alcohol and poly-N-vinyl acetamide, which are preferably blended at a ratio of 100 to 200:1 in terms of amounts of respective components.

8 Claims, 2 Drawing Sheets

PROTECTIVE FILM MATERIAL FOR LASER PROCESSING AND WAFER PROCESSING METHOD USING THE PROTECTIVE FILM MATERIAL

FIELD OF THE INVENTION

The present invention relates to a protective film material that is used to coat the surface of a wafer for protection when the wafer is irradiated with a laser beam to carry out a processing operation such as scribing, dicing or grooving. The present invention also relates to a wafer processing method using the protective film material.

BACKGROUND INFORMATION

On wafers provided with patterns such as LSI, CMOS or power devices formed on a substrate made of a compound such as silicon or sapphire, many devices are formed and partitioned by division lines, called scribe streets or simply streets. When the devices separated lengthwise and widthwise by streets are singularized into individual pieces by dividing at the streets, dicing is carried out by a blade or irradiation with a laser beam. The dicing method by a laser beam is one of the effective methods.

When the dicing is carried out by a laser beam, the irradiation of the laser beam causes explosions at the spots absorbing the laser beam, and processing grooves are formed. The explosions blast substances (debris) by sublimation from the wafer, and the blasted substances adhere as foreign matter (debris) to the portions adjacent to the processing grooves formed on the streets on the wafer surface, and part of the debris also unwantedly adheres to the surface of the devices as well.

As a countermeasure to overcome the foregoing drawbacks of the prior art, there is a method to provide such surroundings that can prevent adherence of debris sublimed and scattered by explosion to the wafers. As such method, a method of spraying an assist gas on the wafer surface to scatter the debris and decomposing and gasifying the scattered debris by use of an environmental gas; a method of vacuum suction; a method of processing under reduced pressure, and the like have been conventionally known. However, these conventional methods require the installation and operation of apparatuses and working conditions thereof are complex. And, removal of debris has not been sufficiently achieved even with such methods, and improvements have been demanded.

Under such circumstances, a method has been employed in which the wafer surface having various devices formed thereon is coated and protected with a resin prior to the irradiation with a laser beam, and the above laser processing treatment is conducted, and then the protective film is removed.

In this method, a water-soluble resin solution is used as a protective film material, and the protective film material is applied to the wafer surface having devices formed thereon by a spin coater to protect the surface. Then, after the laser processing treatment, the debris and the protective film material are washed away (JP-A-2007-073670).

Further, it has been known that a small amount of a laser beam absorbent is incorporated into the protective film material, and after the laser processing treatment, removal of debris is conducted (JP-B-4571850).

The above methods have achieved substantial success in preventing the fixing of debris in the areas near the streets of the wafer. However, these methods are not enough for protection of the device chips since the scattered debris sometimes scatters to the central portion of the device chips away from the streets and fixes thereto, or may sometimes cause burning, scorching or the like by thermal change.

Particularly, for image sensors to be used for cameras, attachment of even a small amount of debris forms stains on the lenses on the surface of the device chips, causing deterioration of performance of the image sensors and an increase in rejection rate, and further improvements to deal with such drawbacks have been demanded.

SUMMARY OF THE INVENTION

It is an object of the present invention to provide a protective film material for laser processing, by which, when the surface of a wafer is subjected to laser processing, it is possible to protect not only sections along streets but also the central portion of device chips by further securely coating the wafer surface with a protective film, and after the processing treatment such as dicing, debris can be removed together with the protective film by washing with water, and thus it becomes possible to obtain a clear wafer surface on which no attachment of debris is seen.

The present invention provides a protective film material for laser processing, which comprises a solution of a water-soluble adhesive and a water-soluble laser beam absorbent added to adjust absorbance at a wavelength of 355 nm (absorbance as calculated as a 200-times diluted solution) to 0.3 to 3.

The water-soluble adhesive is preferably a blend of polyvinyl alcohol and poly-N-vinyl acetamide, and it is more preferred that the former and the latter are blended at a ratio of 100 to 200:1 in terms of amounts of respective components.

Further, the solution of the protective film material for laser processing preferably has a pH of 5 to 8.

The present invention also provides a method for treating a wafer, which comprises coating a surface of a wafer with a protective film material for laser processing, and irradiating the surface of the wafer with a laser beam through the protective film material to accomplish the processing. In an example, the protective film material for laser processing contains a solution of a water-soluble adhesive and a water-soluble laser beam absorbent added to adjust absorbance at a wavelength of 355 nm to 0.3 to 3. In another example, in the protective film material for laser processing, the water-soluble adhesive is a blend of polyvinyl alcohol and poly-N-vinyl acetamide.

According to the method of the present invention, after completion of the laser processing, the water-soluble protective film material can be removed together with the scattered debris by washing with water. As a result, it becomes possible to obtain a clear wafer surface on which no debris is seen.

According to the present invention, a laser processing operation such as scribing, dicing or grooving can be conducted under such condition that the wafer surface is coated and protected with the protective film material. By using the protective film material, it is possible to suppress the formation of debris generated by the laser processing operation and reduce the scattering of debris to the device chips on the wafer. Further, even if the debris is scattered, the device chips are protected by the protective film material, and then the debris can be removed easily together with the protective film material by washing with water. It is therefore possible to obtain a wafer having a clear surface without stains. It is also possible to narrow the width of the processing grooves and realize further efficient production of devices.

Further, the present invention may be widely used for various types of laser processing operations in which re-attachment of foreign matter caused by various processing operations is anticipated. The present invention may also be used for a grooving step by laser grooving of an insulating film such as a Low-k film.

Furthermore, the protective film material may be used for, for example, protection of the surface of various articles from being scratched, as a water-soluble protective film which can be removed easily by washing with water.

BRIEF DESCRIPTION OF THE DRAWINGS

The foregoing summary, as well as the following detailed description of the preferred embodiments of the invention, will be better understood when read in conjunction with the accompanying drawings. For the purpose of illustrating the invention, there is shown in the drawings embodiments which are presently preferred. It should be understood, however, that the invention is not limited to these embodiments.

DETAILED DESCRIPTION OF THE INVENTION

Figure 1A:
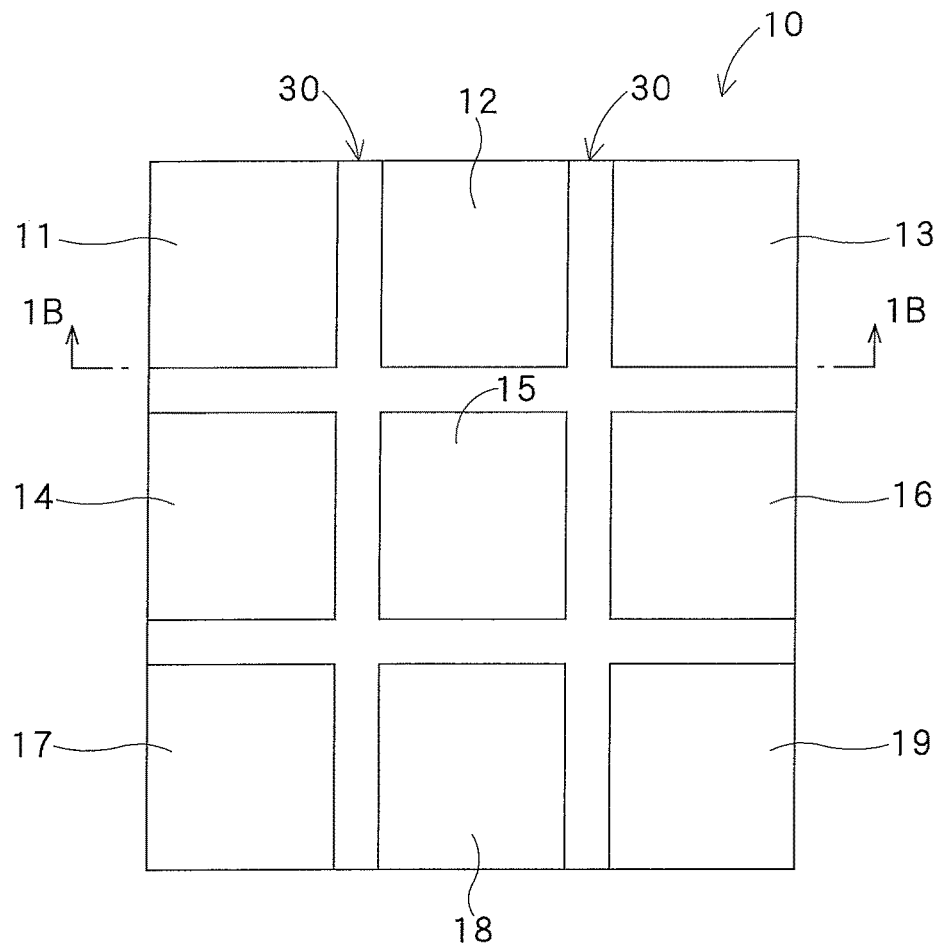
FIG. 1A is a plan view schematically showing a part of a wafer having many circuit structures formed on the wafer surface and partitioned by streets.
Figure 1B:
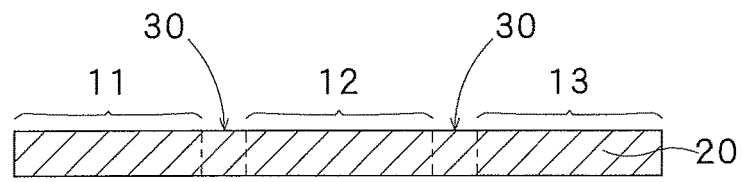
FIG. 1B is a cross-sectional side view along the line 1B-1B of FIG. 1A.

FIG. 1A is a plan view schematically showing a substrate like a wafer having many circuit structures formed on its surface. FIG. 1B is a cross-sectional side view along the line 1B-1B of FIG. 1A.

In FIGS. 1A and 1B, structure 10 includes substrate 20, for example, a semiconductor substance such as silicon, or a semiconductor layer on an insulating material such as glass.

Structure 10 is a part of the structure of a wafer having many circuit structures (dies or chips) 11, 12, 13, 14, 15, 16, 17, 18 and 19 formed on the wafer surface. Respective circuit structures are partitioned on the wafer by streets 30 which are used to separate the circuit structures from the substrate into a discrete die or chip.

Figure 1C:
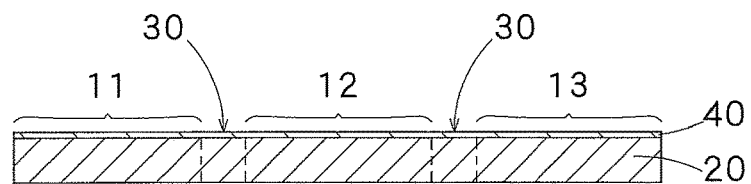
FIG. 1C is a cross-sectional side view showing a condition of a wafer surface having a protective film formed by the present invention illustrated in FIG. 1B.

FIG. 1C shows the condition of FIG. 1B after the protective film for laser processing of the present invention is applied on the wafer surface. The protective film material 40 for laser processing, as seen in the drawing, covers the upper portion of the circuit structures of structure 10 as well as scribe streets 30.

For the protective film material 40 for laser processing of the present invention, a solution of a water-soluble adhesive is used.

As the water-soluble adhesive, although various types may be used, such as, for example, polyvinyl alcohol and poly-N-vinyl acetamide. The polyvinyl alcohol may suitably be blended with poly-N-vinyl acetamide.

The poly-N-vinyl acetamide is preferably a homopolymer of N-vinyl acetamide. The poly-N-vinyl acetamide has a decomposition kick-off temperature of about 350° C. and good heat resistance.

As the poly-N-vinyl acetamide, usually one in the form of a solution dissolved in a solvent is used. The blend ratio of polyvinyl alcohol and poly-N-vinyl acetamide is about 100 to 200:1, preferably about 120 to 170:1 in terms of amounts of respective components. Namely, it is preferred to use poly-N-vinyl acetamide in a small amount.

The weight average molecular weight of polyvinyl alcohol is not particularly limited, but is usually about 5,000 to 30,000, preferably about 7,000 to 20,000, and more preferably 10,000 to 17,000.

Further, the absolute molecular weight of poly-N-vinyl acetamide is about 10,000 to 1,800,000, preferably about 20,000 to 700,000, more preferably about 30,000 to 500,000, furthermore preferably 40,000 to 270,000.

The polyvinyl alcohol and poly-N-vinyl acetamide are both water-soluble. As the solvent, pure water may be used. Further, together with pure water, one or plural types of an alcohol such as isopropyl alcohol, a glycerol, a glycol ether such as propylene glycol monomethyl ether, etc. may be blended. By using such a blend, it is possible to improve the wetting property and spreadability and enhance the coating properties when the wafer surface is protected with the protective film material for laser processing.

The solution of the water-soluble adhesive contains a water-soluble laser beam absorbent which is capable of absorbing the processing laser beam.

As the laser beam for performing the laser processing, ultraviolet rays having a wavelength of 355 nm, visible rays having a wavelength of 532 nm, and infrared rays having a wavelength of 790 nm or 1064 nm, etc. are known.

As the laser beam absorbent corresponding to these wavelengths, for example, for absorption of ultraviolet rays, a triadine type, a benzophenone type, a benzotriazole type, an anthraquinone type and a distyrylbiphenyl derivative are known. As the benzophenone type laser beam absorbent, 2-hydroxy-4-methoxybenzophenone-5-sulfonic acid (trihydrate) may be mentioned.

For absorption of infrared rays, 1,1,5,5-tetrakis[4-(diethylamino)phenyl]-1,4-pentadiene-3-ylium and p-toluenesulfonate may be mentioned.

Alternatively, any other known absorbent for ultraviolet rays, visible rays or infrared rays, such as colorants and dyes may be used.

The laser beam absorbent may be used in such an amount that the absorbance at a wavelength of 355 nm (absorbance as calculated as a 200-times diluted solution) becomes about 0.3 to 3, preferably about 0.3 to 1.5. This specific amount is larger than the amounts that have been conceived in the prior art, namely relatively high concentration. This absorbance is measured by the same method as used for "absorbance" in the "experiment" described later.

The protective film material 40 for laser processing is applied on the surface of a wafer by, for example, spin coating or spraying to form a uniform coated face. The protective film for laser processing may be used as it is without any baking operation.

The protective film material 40 for laser processing may contain a surfactant, etc. in order to prevent the material from being repelled from the wafer surface, increase coating properties by providing wetting ability, and further increasing the storage stability of its solution. As the surfactant, nonionic, cationic, anionic or amphoteric surfactants may be used so long as they are water-soluble.

The nonionic surfactants may, for example, be a nonylphenol type, a higher alcohol type, a polyhydric alcohol type, a polyoxyalkylene glycol type, a polyoxyethylene alkylester type, a polyoxyethylene alkylether type, a polyoxyethylene alkylphenolether type or a polyoxyethylene sorbitan alkylester type.

The cationic surfactants may, for example, be a quaternary ammonium salt or an amine salt. The anionic surfactants may, for example, be an alkylbenzene sulfonic acid or its salt, alkylsulfonic acid ester salt, methyl taurine salt, ether sulfonate, etc. The amphoteric surfactants may, for example, be an imidazolinium betaine type, an amidopropyl betaine type or an aminodipropionate type.

One or two or more types of the above surfactants may appropriately be selected. The surfactant is usually contained as an effective component in an amount of about 0.05 mass % to 5 mass % on the basis of the total content of the protective film material.

Further, if necessary, a preservative such as phenyl glycol may be added to the protective film material in order to increase storage stability. Moreover, a plasticizer, an organic acid, etc. may be used as the case requires.

The protective film material for laser processing is not particularly limited in the pH value in the form of a solution, but preferably about 5 to 8, more preferably about 6 to 8. By adjusting the pH value within such a so-called neutral range, the solution can be handled easily, influence on the wafer processing apparatus is low, maintenance of apparatuses can be made easily, and the material is less harmful to workers and equipment. This pH value is measured by the same method as used in the after-mentioned "experiment".

The method for adjusting the pH value is not particularly limited, and various types of methods may be used. In the after-mentioned examples and comparative examples, triethanolamine is used to adjust the pH value.

Figure 2:
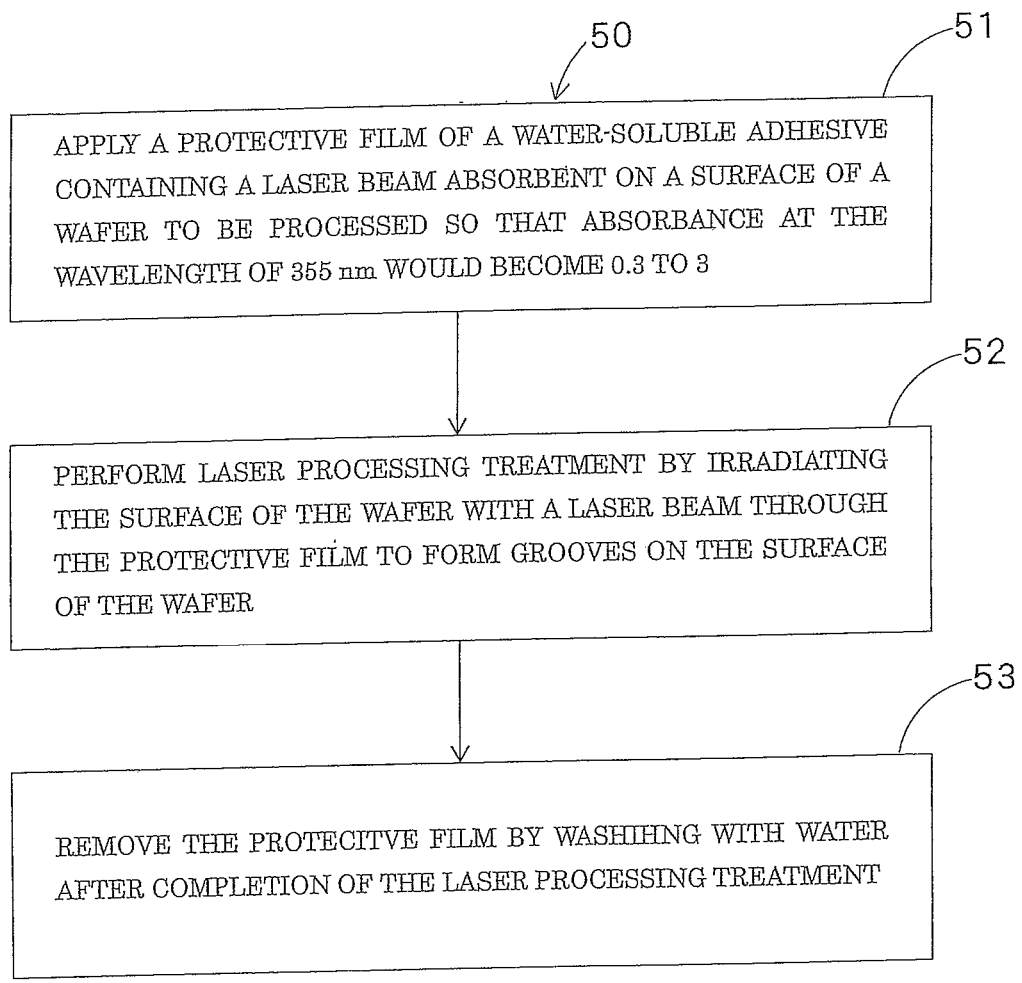
FIG. 2 is a flow chart showing the steps of the wafer processing method of the present invention.

FIG. 2 is a flow chart of a method illustrating a typical example of wafer processing operation 50 using the protective film material of the present invention.

As illustrated by the protective film material 40 in FIG. 1C, the protective film material of the present invention is applied to the wafer surface by, for example, spin coating or spraying (step 51).

This step is followed by a laser processing treatment in which the wafer surface (including the streets 30 shown in FIGS. 1A to 1C) is irradiated with a laser beam through the protective film material in order to form grooves on the wafer surface along the streets (step 52).

When the street portions are irradiated with a laser beam, the laser beam is absorbed appropriately by the protective film material for laser processing which contains the laser beam absorbent sufficiently. And, the street portions can be securely processed, formation of debris can be reduced, and scattering of debris can be reduced.

There is another method in which laser processing is repeatedly conducted several times on the same street to gradually increase the depth of cut. In such a method, since the atmosphere over the streets tends to contain vaporized components of the wafer, a part of laser beam is scattered on the streets and applied to device sections, by which deficiencies such as stains or burning may sometimes be caused on the device sections. However, in the present invention, generation of such deficiencies can be suppressed.

As mentioned above, after the laser processing treatment using the protective film material of the present invention (step 52), the water-soluble protective film material is washed with water and removed together with the scattered debris, and as the result, a clear wafer surface without attachment of debris can be obtained (step 53).

The washing may be conducted by using a brush, applying ultrasonic waves, or washing with a mixed liquid of water with a gas such as compressed air or nitrogen. By doing so, the protective film may be removed efficiently together with debris generated by the processing treatment.

EXAMPLES

The following materials were prepared to conduct the after-mentioned examples and comparative examples.
1. Polyvinyl alcohol (PVA): having a weight average molecular weight of about 15,000
2. Poly-N-vinyl acetamide-1 (PNVA-1): a solution containing 12.5 mass % of a component having an absolute molecular weight of 300,000
3. Poly-N-vinyl acetamide-2 (PNVA-2): a solution containing 10 mass % of a component having an absolute molecular weight of 50,000
4: Laser beam absorbent: 2-hydroxy-4-methoxybenzophenone-5-suflonic acid (trihydrate) (absorbent for a laser beam of 355 nm)
5. Triethanolamine (TEA): pH adjuster
6. Phenyl glycol: preservative
7. Propylene glycol monomethyl ether (PGM)
8. Pure water (ion-exchanged water)

Example 1

16.2 mass % of PVA, 0.8 mass % of PNVA-1, 1.5 mass % of the laser beam absorbent, 0.6 mass % of TEA, 1.0 mass % of phenyl glycol, 15.0 mass % of PGM and 64.9 mass % (balance) of the pure water were thoroughly mixed to obtain a protective film material for laser processing.

Examples 2 to 4

Protective film materials for laser processing of Examples 2 to 4 were obtained on the basis of the compositions as shown in Table 1 in accordance with the procedure of Example 1.

Example 5

13.1 mass % of PVA, 1.0 mass % of PNVA-2, 1.85 mass % of the laser beam absorbent, 0.75 mass % of TEA, 1.0 mass % of phenyl glycol, 15.0 mass % of PGM and 67.3 mass % (balance) of the pure water were thoroughly mixed to obtain a protective film material for laser processing.

Examples 6 and 7

Protective film materials for laser processing of Examples 6 and 7 were obtained on the basis of the compositions as shown in Table 2 in accordance with the procedure of Example 5.

Comparative Example 1

16.2 mass % of PVA, 0.8 mass % of PNVA-1, 1.18 mass % of the laser beam absorbent, 0.5 mass % of TEA, 1.0 mass % of phenyl glycol, 15.0 mass % of PGM and 65.32 mass % (balance) of the pure water were thoroughly mixed to obtain a protective film material for laser processing.
Test The following tests were conducted to measure properties and performance of the Examples and Comparative Example.

Testing Method
1. Viscosity
   Viscosity (mPa·s) at 25° C. was measured in accordance with JIS K6833
2. pH
   pH value at 25° C. was measured in accordance with JIS Z8802
3. Absorbance
   200-times diluted solutions of the protective film materials for laser processing of the Examples and Comparative Example were prepared, and absorbance (Abs) of 355 nm at 25° C. was measured in accordance with JIS K0115
4. Total Evaluation
   Each of the protective film materials for laser processing of the Examples and Comparative Example was applied to the surface of a wafer having an image sensor for camera formed thereon by using a spin coater, and subjected to a dicing treatment by a laser beam of 355 nm, and then washed with water.
   After the washing treatment, the laser processing performance and the surface condition of the image sensor were observed by a laser microscope.
   Total evaluation was conducted based on the following standard.
   Superior (⊚): laser processing performance is good, no attachment of debris on the device surface is observed, and therefore it is excellent as an image sensor.
   Excellent (○): while laser processing performance is slightly inferior to the above "Superior (⊚)", no attachment of debris on the device surface is observed, and therefore it is excellent as an image sensor.
   Poor (×): laser processing performance is inferior to the above "Excellent (○)", and a few attachment of debris on the device surface is observed.
Results
   The results of the above experiments are shown in Tables 1 and 2.
Comments
   In Example 1, the blend ratio of PVA and PNVA-1 is 162:1, the viscosity is 95.4, the pH value is 6.07, the absorbance is 0.369, and the total evaluation is "Excellent (○)". In Example 2, the added amounts of the laser beam absorbent and TEA are increased as compared with Example 1, the viscosity is 104.0, the pH value is 6.31, namely these values are at the same level as Example 1, whereas the absorbance is increased to 0.450, and the total evaluation is "Excellent (○)".
   In Example 3, the blend ratio of PVA and PNVA-1 is 120:1, and the added amount of the laser beam absorbent is the same as Example 2, but the added amount of TEA is smaller than Example 2. In this example, the viscosity is 46.0 and the pH value is 4.15, namely these values are lower than Example 2, whereas the absorbance is 0.441, and the total evaluation is "Excellent (○)".
   In Example 4, the blend ratio of PVA and PNVA-1 is 140:1, the viscosity is 69.2, namely this value is higher than Example 3, the pH value is 4.41, the absorbance is 0.452, and the total evaluation is "Excellent (○)".
   Further, in the solutions of the protective film materials for laser processing of Examples 1 to 4, turbidity was somewhat observed.
   In Examples 5 to 7, PNVA-2 having an absolute molecular weight smaller than that of PNVA-1 is used, and the blend ratio of PVA and PNVA-2 is 131:1. In Example 5, the added amount of the laser beam absorbent is the same as Examples 3 and 4, and the added amount of TEA is increased as compared with Examples 3 and 4. The viscosity is 59.2, the pH value is 6.07, the absorbance is 0.442, and the total evaluation is "Superior (⊚)".
   In Example 6, the added amounts of the laser beam absorbent and TEA are increased as compared with Example 5. In this example, the viscosity is 64.5 and the pH value is 6.31, namely these are substantially the same as those of Example 5, whereas the absorbance is increased to 0.628, and the total evaluation is "Superior (⊚)".
   In Example 7, the added amounts of the laser beam absorbent and TEA are further increased as compared with Example 6. In this example, the viscosity is 69.0 and the pH value is 6.31, namely these are substantially the same as those of Example 6, whereas the absorbance is increased to 0.940, and the total evaluation is "Superior (⊚)".
   Further, in the solutions of the protective film materials for laser processing of Examples 5 to 7, turbidity was not observed unlike Examples 1 to 4.
   In each of Examples 5 to 7, the absorbance is increased to a level of about 0.44 to 0.94. It is therefore found that the protective film materials for laser processing showing a high absorbance of a laser beam show such further favorable results that formation of debris is small, devices formed on the surface of a wafer such as an image sensor are hardly stained, and excellent devices can be obtained. It is also found that the viscosity is preferably about 60 to 70 and the pH value is preferably about 6 to 6.4.
   As compared with these results, in Comparative Example 1, the added amounts of the laser beam absorbent and TEA are decreased as compared with Example 1, the viscosity is 99.6, the pH value is 6.15, namely these values are at the same level as Example 1, whereas the absorbance is only 0.280, and the total evaluation is "Poor (×)" and therefore the desired results cannot be obtained.
   Further, in the solution of the protective film material for laser processing of Comparative Example 1, some turbidity was observed.

TABLE 1

|  | Ex. 1 | Ex. 2 | Ex. 3 | Ex. 4 |
| --- | --- | --- | --- | --- |
| PVA | 16.2 | 16.2 | 12.0 | 14.0 |
| PNVA-1 | 0.8 | 0.8 | 0.8 | 0.8 |
| PNVA-2 |  |  |  |  |
| Laser beam absorbent | 1.5 | 1.85 | 1.85 | 1.85 |
| TEA | 0.6 | 0.8 | 0.54 | 0.54 |
| Preservative | 1.0 | 1.0 | 1.0 | 1.0 |
| PGM | 15.0 | 15.0 | 15.0 | 15.0 |
| Pure water | 64.9 | 64.35 | 68.81 | 66.81 |
| Total | 100.0 | 100.0 | 100.0 | 100.0 |
| Viscosity (mPa · s) | 95.4 | 104.0 | 46.0 | 69.2 |
| pH | 6.07 | 6.31 | 4.15 | 4.41 |
| Absorbance (*) | 0.369 | 0.450 | 0.441 | 0.452 |
| Total evaluation | ○ | ○ | ○ | ○ |

(*) as calculated as a 200-times diluted solution

TABLE 2

|  | Ex. 5 | Ex. 6 | Ex. 7 | Comp. Ex. 1 |
| --- | --- | --- | --- | --- |
| PVA | 13.1 | 13.1 | 13.1 | 16.2 |
| PNVA-1 |  |  |  | 0.8 |
| PNVA-2 | 1.0 | 1.0 | 1.0 |  |
| Laser beam absorbent | 1.85 | 2.61 | 3.92 | 1.18 |
| TEA | 0.75 | 1.08 | 1.62 | 0.5 |
| Preservative | 1.0 | 1.0 | 1.0 | 1.0 |
| PGM | 15.0 | 15.0 | 15.0 | 15.0 |
| Pure water | 67.30 | 66.21 | 64.36 | 65.32 |
| Total | 100.0 | 100.0 | 100.0 | 100.0 |

TABLE 2-continued

|  | Ex. 5 | Ex. 6 | Ex. 7 | Comp. Ex. 1 |
|---|---|---|---|---|
| Viscosity (mPa · s) | 59.2 | 64.5 | 69.0 | 99.6 |
| pH | 6.07 | 6.31 | 6.31 | 6.15 |
| Absorbance (*) | 0.442 | 0.628 | 0.940 | 0.280 |
| Total evaluation | ◎ | ◎ | ◎ | X |

(*) as calculated as a 200-times diluted solution

From the foregoing description, in accordance with the protective film material and wafer processing method according to the present invention, it is readily appreciated and understood that the wafer surface can be securely protected, and after the laser processing, debris can be effectively removed together with the protection film material, and a wafer with a clear surface can be obtained.

The present invention is not limited to the details of the above described embodiments. The scope of the invention is defined by the appended claims and all changes and modifications that fall within the scope of the claims are therefore to be embraced by the invention.

We claim:

1. A protective film material for laser processing, comprising:
    a solution of a water-soluble adhesive and a water-soluble laser absorbent,
    wherein the water-soluble adhesive is a blend of polyvinyl alcohol and poly-N-vinyl acetamide at a ratio of 100 to 200:1 in the amounts of the respective components, and
    wherein the water-soluble laser beam absorbent is present in an amount effective to adjust absorbance at a wavelength of 355 nm (absorbance as calculated as a 200 times diluted solution) to 0.3 to 3.

2. The protective film material for laser processing according to claim 1, wherein the poly-N-vinyl acetamide has an absolute molecular weight of about 10,000 to 1,800,000.

3. The protective film material for laser processing according to claim 1, wherein the solution of the protective film material for laser processing has a pH of 5 to 8.

4. A wafer having a surface coated with the protective film material as defined in claim 1, wherein the protective film material is applied to protect the surface of the wafer during a laser processing treatment carried out thereon, and is removable by washing with water from the surface of the wafer after completion of the laser processing treatment.

5. The wafer according to claim 4, wherein the poly-N-vinyl acetamide has an absolute molecular weight of about 10,000 to 1,800,000.

6. The wafer according to claim 4, wherein the solution of the protective film material for laser processing has a pH of 5 to 8.

7. A protective film for a laser processing treatment, in combination with a wafer having a surface provided with a plurality of circuit devices separated by scribe streets, the protective film comprising a film of a water-soluble adhesive and a water-soluble laser beam absorbent present in an amount effective to adjust absorbance at a wavelength of 355 nm (absorbance as calculated as a 200-times diluted solution) to 0.3, to 3, the water-soluble adhesive comprising a blend of polyvinyl alcohol and poly-N-vinyl acetamide blended at a ratio of 100 to 200:1 in terms of amounts of the respective components, the protective film existing on the surface of the wafer during the laser processing treatment and being readily removable by water from the surface of the wafer, including the surfaces of circuit devices, after the laser processing treatment.

8. The protective film according to claim 7, wherein the solution of the protective film material for laser processing has a pH of 5 to 8.

* * * * *